(12) United States Patent
Georgescu et al.

(10) Patent No.: US 12,393,346 B1
(45) Date of Patent: Aug. 19, 2025

(54) TECHNIQUES FOR MANAGING PROGRAM DISTURB IN NON-VOLATILE MEMORY

(71) Applicant: Cypress Semiconductor Corporation, San Jose, CA (US)

(72) Inventors: Bogdan Georgescu, Colorado Springs, CO (US); Antwerpen Hans Van, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 28 days.

(21) Appl. No.: 18/443,899

(22) Filed: Feb. 16, 2024

(51) Int. Cl.
*G06F 3/06* (2006.01)
*G11C 16/34* (2006.01)

(52) U.S. Cl.
CPC .......... *G06F 3/0616* (2013.01); *G06F 3/0659* (2013.01); *G06F 3/0673* (2013.01); *G11C 16/34* (2013.01)

(58) Field of Classification Search
CPC .... G06F 3/0616; G06F 3/0659; G06F 3/0673; G11C 16/34
See application file for complete search history.

(56) References Cited

U.S. PATENT DOCUMENTS

| 2017/0316826 A1* | 11/2017 | Nakanishi | G11C 29/52 |
| 2018/0102159 A1* | 4/2018 | Ong | G11C 15/04 |
| 2022/0137842 A1* | 5/2022 | Hung | G06F 11/0754 |
| | | | 711/166 |

* cited by examiner

*Primary Examiner* — Tim T Vo
*Assistant Examiner* — Janice M. Girouard

(57) ABSTRACT

A program operation targeted to a first page in a sector of non-volatile memory is identified. The sector includes an array of memory cells comprising a set of pages including the first page, and each page in the set of pages includes a set of tracking bits reserved for storing values of a freshness counter. A processing device determines a second page in the set of pages has been exposed to a maximum number of program operations in the set of pages based on a value of the freshness counter stored in the set of tracking bits of the second page. The maximum number of program operations is determined to exceed a program disturb threshold for the sector. The second page in the sector of non-volatile memory is refreshed in response to determining that the maximum number of program operations exceeds the program disturb threshold for the sector.

20 Claims, 8 Drawing Sheets

500a

| FIRST PAGE COUNTER VALUES 502a ||
|---|---|
| FRESHNESS COUNTER: 1 | ENDURANCE COUNTER: 1 |
| SECOND PAGE COUNTER VALUES 502b ||
| FRESHNESS COUNTER: 2 | ENDURANCE COUNTER: 1 |
| THIRD PAGE COUNTER VALUES 502c ||
| FRESHNESS COUNTER: 3 | ENDURANCE COUNTER: 1 |
| FOURTH PAGE COUNTER VALUES 502d ||
| FRESHNESS COUNTER: 4 | ENDURANCE COUNTER: 1 |
| FIFTH PAGE COUNTER VALUES 502e ||
| FRESHNESS COUNTER: 5 | ENDURANCE COUNTER: 1 |

CURRENT FRESHNESS COUNTER VALUE: 499 — 504a

| FIRST PAGE COUNTER VALUES 506a ||
|---|---|
| FRESHNESS COUNTER: 1 | ENDURANCE COUNTER: 1 |
| SECOND PAGE COUNTER VALUES 506b ||
| FRESHNESS COUNTER: 2 | ENDURANCE COUNTER: 1 |
| THIRD PAGE COUNTER VALUES 506c ||
| FRESHNESS COUNTER: 500 | ENDURANCE COUNTER: 2 |
| FOURTH PAGE COUNTER VALUES 506d ||
| FRESHNESS COUNTER: 4 | ENDURANCE COUNTER: 1 |
| FIFTH PAGE COUNTER VALUES 506e ||
| FRESHNESS COUNTER: 5 | ENDURANCE COUNTER: 1 |

CURRENT FRESHNESS COUNTER VALUE: 500 — 504b

| FIRST PAGE COUNTER VALUES 508a | |
|---|---|
| FRESHNESS COUNTER: 501 | ENDURANCE COUNTER: 2 |
| SECOND PAGE COUNTER VALUES 508b | |
| FRESHNESS COUNTER: 2 | ENDURANCE COUNTER: 1 |
| THIRD PAGE COUNTER VALUES 508c | |
| FRESHNESS COUNTER: 500 | ENDURANCE COUNTER: 2 |
| FOURTH PAGE COUNTER VALUES 508d | |
| FRESHNESS COUNTER: 4 | ENDURANCE COUNTER: 1 |
| FIFTH PAGE COUNTER VALUES 508e | |
| FRESHNESS COUNTER: 5 | ENDURANCE COUNTER: 1 |

CURRENT FRESHNESS COUNTER VALUE: 501 — 504c

FIG. 5C

TECHNIQUES FOR MANAGING PROGRAM DISTURB IN NON-VOLATILE MEMORY

TECHNICAL FIELD

The present disclosure relates generally to the field of non-volatile memory, and more particularly, to techniques for managing program disturb in non-volatile memory.

BACKGROUND

A non-volatile memory refers to a type of computer memory that can retain stored information even after power is removed. Flash memory is a type of non-volatile memory that can be electrically erased and reprogrammed. Endurance, retention, and program disturb limits are parameters defining various characteristics of many non-volatile memories, such as flash memory. Endurance relates to the number of times an individual page can be programmed/erased before the page is no longer guaranteed to function properly. Retention relates to the length of time information in a page is retained after a specific number of program/erase cycles (also referred to as program operations) and for a specific average storage temperature. The program disturb limit (also referred to as write disturb limit) relates to the number of program operations that can occur on other rows within a sector of memory after a page is written before the page needs to be refreshed.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIGS. 5A-5C illustrate various aspects of managing program disturb in non-volatile memory according to some embodiments.

DETAILED DESCRIPTION

Figure 1:
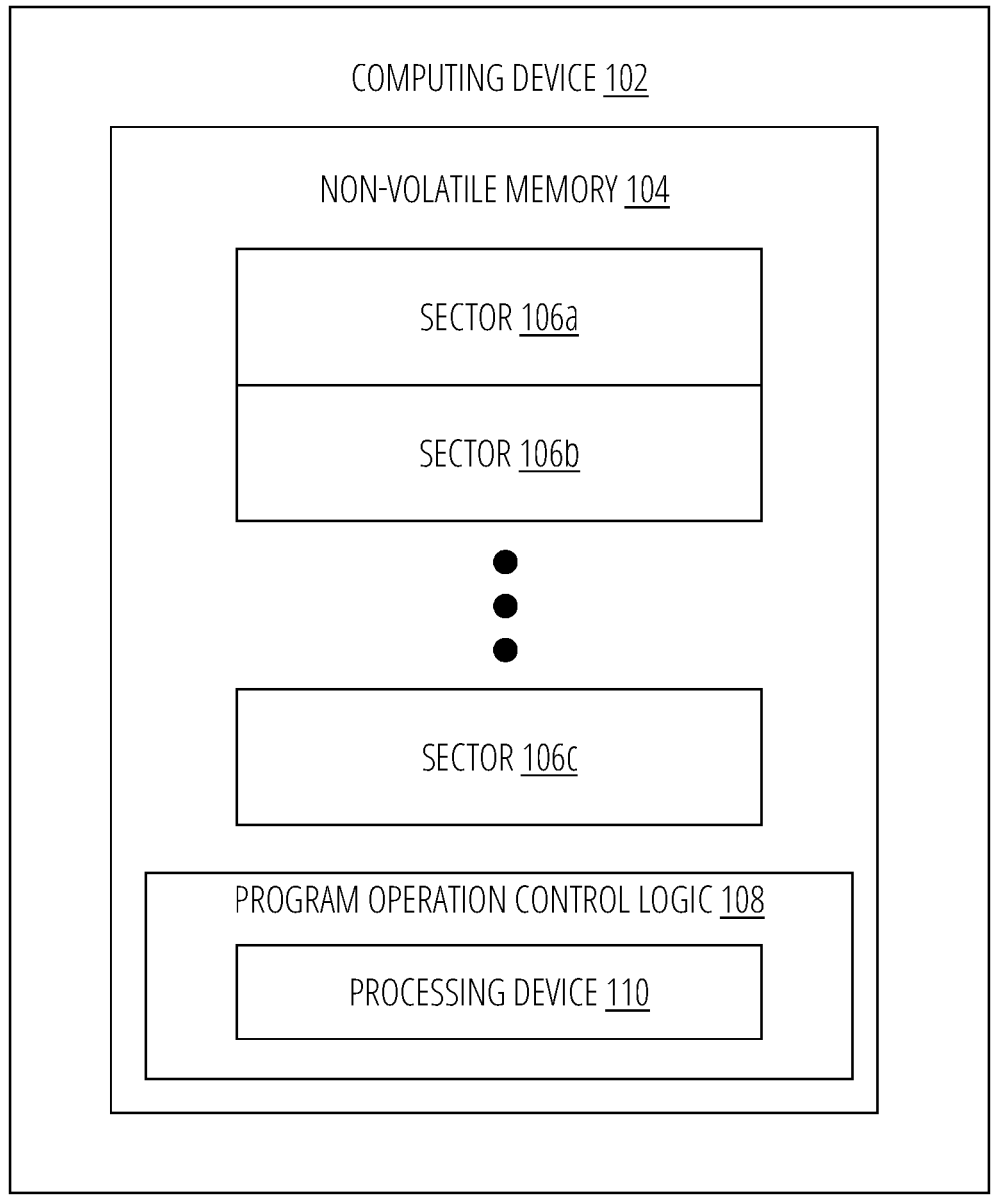
FIG. 1 illustrates an exemplary operating environment for a non-volatile memory according to some embodiments.

The following description sets forth numerous specific details such as examples of specific systems, components, methods, and so forth, in order to provide a good understanding of various embodiments of the techniques described herein for managing program disturb in a non-volatile memory. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

The program disturb effect has become a significant effect in many non-volatile memories for computers. Generally, the program disturb effect erodes the charge stored in a non-volatile memory cell when program cycles occur to other pages in the same sector of memory. This charge erosion limits the number of program operations allowed in a sector before a refresh and before the useful life of the non-volatile memory is over. A sector may refer to a set of pages in a non-volatile memory that utilize the same multiplexing structure and sense amplifier bank. After a page is programmed in a sector, a threshold number of program operations can occur to other pages in the sector before the page needs to be refreshed. The threshold number of program operations that can occur to other pages in the sector before a page needs to be refreshed is referred to as the program disturb limit. Additionally, a threshold number of program operations can be performed on a page before the useful life of the page is over. The threshold number of program operations can be performed on a page before the useful life of the page is over is referred to as the endurance limit.

One challenge caused by the program disturb effect is tracking program operations associated with pages in a sector and triggering refresh operations in response to program operations associated with pages exceeding the program disturb and/or endurance threshold. Some existing techniques attempt to side-step the issue by dedicating various sectors of memory to specific purposes, such as for electrically erasable programmable read-only memory (EEPROM) emulation. However, this results in unnecessary constraints for using the memory and can increase the overall area of the memory chip. Additionally, or alternatively, existing techniques may fail to accurately and/or efficiently track these parameters, resulting excessive refresh operations and/or premature determinations that a page should not be programmed any more due to the useful life of the page being over. For example, some existing techniques may determine the useful life of an entire sector is over based on the program disturb limit being exceeded for a single page. In another example, some existing techniques may track program operations at a higher level of abstraction or in different memory, which demands additional management overhead. These limitations can drastically reduce the efficiency, adaptability, and usability of non-volatile memories, contributing to inefficient systems, devices, and techniques with limited capabilities.

Embodiments of the present disclosure address the above and other problems with techniques for managing program disturb and/or endurance in non-volatile memories. In many embodiments, a set of tracking bits may be reserved for each page in a memory sector. In many such embodiments, these tracking bits may be utilized to determine when to refresh the page and/or prevent future use of the page. For example, the tracking bits may be utilized to store values for a freshness counter and for an endurance counter. In various embodiments, the tracking bits may be stored in specific columns that are added to the memory array of a sector. For example, a column may be added to each sense amplifier to create the space for the tracking bits. The freshness counter values may be utilized to determine when a page needs to be refreshed, such as based on a program disturb threshold, and the endurance counter values may be utilized to determine when future program operations to a page should be prevented, such as based on an endurance threshold. The freshness counter may be sector specific. Thus, the current value of the freshness counter may be stored in the tracking bits of the target page of the program operation and then incremented each time a program operation is performed on the sector of non-volatile memory. In many embodiments, the current value of the freshness counter may be tracked, such as using a register. On the other hand, the endurance counter may be page specific. Thus, the current value of the endurance counter for a page may be incremented each time a program operation is performed on that page. In some embodiments, each sector may include one or more scratch pages to facilitate reliable page refreshes, such as when power is lost during the refresh. Additionally, or alternatively, the tracking bits may be utilized to store an address of the corresponding page to facilitate reliable page refreshes, such as when power is lost during the refresh.

In an illustrative embodiment, a program operation targeted to a first page of a set of pages in a sector of non-volatile memory may be identified. In response, a second page in the set of pages having a maximum number of program operations for the sector may be determined based on a value of a freshness counter stored in the set of tracking bits in the second page. The maximum number of program operations may then be compared to a program disturb threshold for the sector of non-volatile memory to determine whether to refresh the second page. If the maximum number of program operations exceeds the program disturb threshold, the second page may be refreshed.

In several embodiments, the maximum number of program operations for a sector before a refresh operation needs to be triggered may be determined as a difference between the current value of the freshness counter and the value of the freshness counter in the tracking bits of the oldest programmed page in the sector. In several such embodiments, the oldest page in the sector may be the page with the smallest value for the freshness counter in the sector. In some embodiments, the oldest programmed page in the sector may be tracked, such as using a register. In other embodiments, the value of the freshness counter for each page may be evaluated to determine the oldest programmed page in the sector. Further, the page with the highest value for the freshness counter in the sector may be referred to as the newest programmed page. In various embodiments, the newest programmed page in the sector may be tracked, such as using a register. Additionally, when a page is refreshed, current data in the page may be copied to one of the scratch pages in the sector and then written back to the page along with a current value of the refresh counter in the tracking bits of the page. Further, in many embodiments, a value of the endurance counter for the page may be incremented and written back to the page along with the current value of the refresh counter.

In these and other ways, components/techniques described hereby may provide many technical advantages. For example, embodiments may utilize counters and tracking bits to reliably and accurately determine when pages need to be refreshed and/or when future program operations to a page should be prevented. In another example, values for the counters may be stored in each page to efficiently determine when pages need to be refreshed and/or when future program operations to a page should be prevented. In yet another example, embodiments may utilize scratch pages and/or tracking bits to prevent data loss during refresh operations, such as when power is lost during a refresh operation. Thus, the computer-based techniques of the current disclosure improve performance and reliability of non-volatile memories as compared to conventional approaches. Further, embodiments disclosed hereby can be practically utilized to improve the functioning of a computer and/or to improve a variety of technical fields including non-volatile memory design, non-volatile memory operation, program disturb management, and endurance management.

The illustrative examples and embodiments provided above are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure. Accordingly, although the techniques described hereby are described in detail with respect to a few exemplary implementations, it will be appreciated that the techniques described hereby can be implemented in a variety of manners and forms without departing from the scope of this disclosure.

FIG. 1 illustrates an exemplary operating environment 100 for a non-volatile memory 104 according to some embodiments. In the illustrated embodiment, operating environment 100 includes a computing device 102 with non-volatile memory 104. The non-volatile memory 104 includes one or more sectors 106a, 106b, 106c (collectively referred to as sectors 106) and program operation control logic 108 with a processing device 110. Each of the sectors 106 may include a set of pages and each of the pages may include a set of bits with one or more tracking bits. In various embodiments described hereby, the program operation control logic 108 may utilize the one or more tracking bits for each page to track a number of program operations performed on each of the sectors 106. In various such embodiments, the program operation control logic 108 may determine when to refresh pages based on the number of program operations performed on each of the sectors 106. Additionally, or alternatively, in some embodiments, program operation control logic 108 may utilize the one or more tracking bits for each page to track a number of program operations performed on each page of each of the sectors 106. In some such embodiments, the program operation control logic 108 may determine when to prevent future program operations to a page based on the number of program operations performed on the page. One or more components of FIG. 1 may be the same or similar to one or more other components disclosed hereby. Further, aspects discussed with respect to various components in FIG. 1 may be implemented by one or more other components from one or more other embodiments without departing from the scope of this disclosure. For example, one or more portions of or one or more techniques implemented by program operation control logic 108 may be implemented by other components of the computing device 102, such as a register, without departing from the scope of this disclosure. Embodiments are not limited in this context.

As discussed in more detail below, in various embodiments, each of the sectors 106 may include one or more additional columns for storing tracking bits. Additionally, or alternatively, each of the sectors 106 may include one or more scratch pages for facilitating efficient and reliable refreshing of memory pages.

It should be noted that although a single processing device (i.e., processing device 110) and a single storage device (i.e., non-volatile memory 104) are depicted for simplicity, other embodiments may include multiple processing devices and/or multiple storage devices. For example, computing device 102 may include a first non-volatile memory with a first processing device and a second non-volatile memory with a second processing device. The processing device 110 may include a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 110 may also include one or more special-purpose processing devices such as an application specific integrated circuit (ASIC), a field programmable gate array (FPGA), a digital signal processor (DSP), network processor, or the like.

Figure 2A:
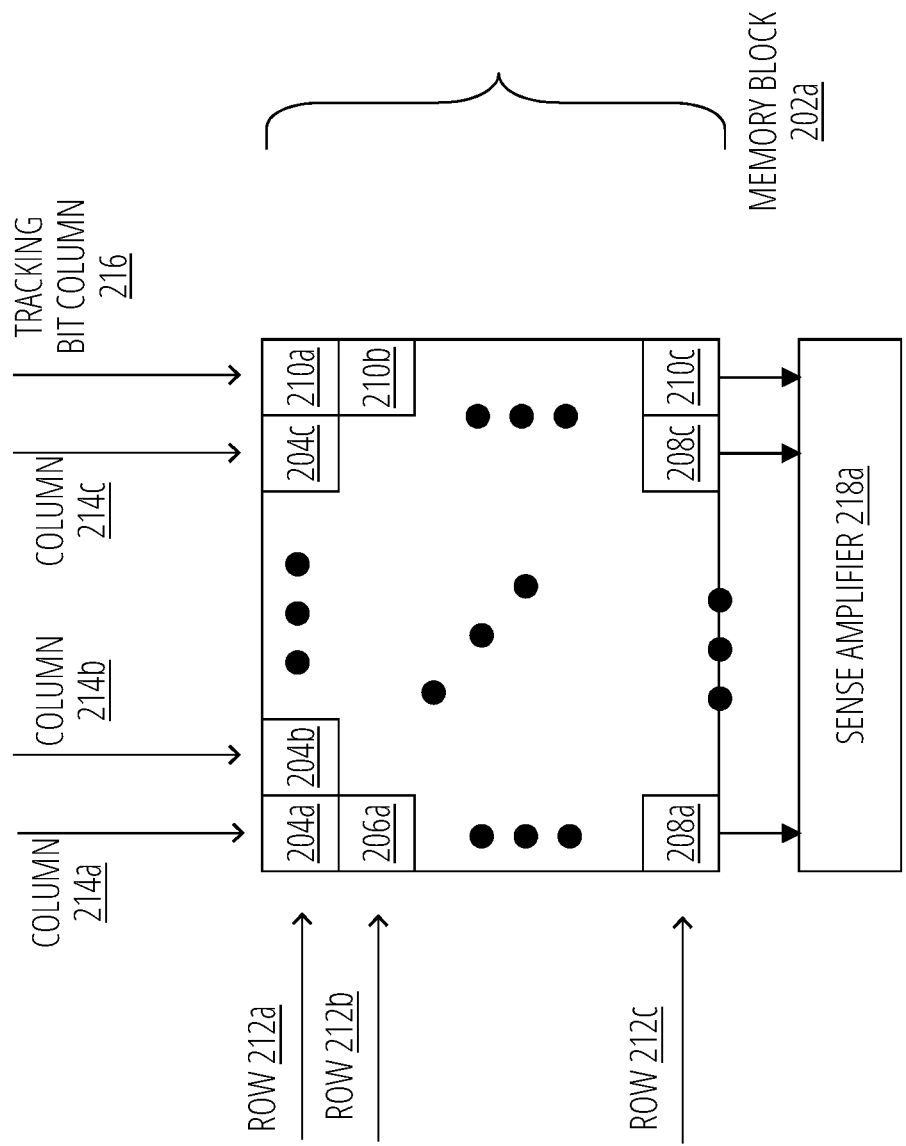
FIG. 2A illustrates various aspects of a memory block according to some embodiments.

FIG. 2A illustrates various aspects of a memory block 202a according to some embodiments. In the illustrated embodiment, the memory block 202a includes an array of memory cells organized in rows 212a, 212b, 212c and columns 214a, 214b, 214c, 216. Further, each of the columns is connected to a sense amplifier 218a. In various embodiments disclosed hereby, the memory block 202a includes a tracking bit column 216 including memory cells 210a, 210b, 210c (collectively referred to a memory cells 210). Each of the memory cells 210 in the tracking bit column 216 may be utilized for storing values associated with tracking program operations performed on a sector of non-volatile memory including the memory block 202a. One or more components of FIG. 2A may be the same or similar to one or more other components disclosed hereby. For example, a plurality of memory blocks 202a may be the same or similar to one or more of sectors 106. Further, aspects discussed with respect to various components in FIG. 2A may be implemented by one or more other components from one or more other embodiments without departing from the scope of this disclosure. Embodiments are not limited in this context.

Each of the memory cells in memory block 202a may store a bit of data and each row/column may include one or more memory cells. In various embodiments, each row may include one or more portions of a word line and each column may include one or more portions of a bit line in a non-volatile memory. In one embodiment, the memory block 202a may include 33 columns. In the illustrated embodiment, row 212a includes memory cells 204a, 204b, 204c, 210a; row 212b includes memory cells 206a, 210b; and row 212c includes memory cells 208a, 208c, 210c. Similarly, column 214a includes memory cells 204a, 206a, 208a; column 214b includes memory cell 204b; column 214c includes memory cells 204c, 208c; and tracking bit column 216 includes memory cells 210a, 210b, 210c. As will be discussed in more detail below, a sector of memory may include a plurality memory blocks 202a, such as 64 or 128 memory blocks. In many embodiments, each memory block may include one tracking bit column 216 with the other columns being utilized to store other data, such as user data or code. In one embodiment, for example, each memory block may include 33 columns with 1 column utilized for storing values associated with tracking program operations performed on the sector of non-volatile memory and the other 32 columns utilized for storing other data. More generally, each memory block may include N+t columns, where N is the number of columns utilized to store user data or code and t is the number of columns utilized to track program operations. Although the examples described herein utilize a value of one for t, some embodiments may utilize a value larger than one for t without departing from the scope of this disclosure.

Further, in various embodiments, each memory block may be coupled to one sense amplifier 218a. In various such embodiments, a memory block may correspond to one input/output in the memory architecture. The sense amplifier may be part of the read circuitry that is used when data is read from the memory block 202a. The sense amplifier 218a may sense low power signals from a bit line (e.g., column 214b) that represents a data bit (1 or 0) stored in a memory cell (e.g., memory cell 204b), and amplify the small voltage swing to recognizable logic levels so the data can be interpreted properly by other components (e.g., program operation control logic 108). In some embodiments, a memory block may include an array of memory cells that are coupled to a single sense amplifier. Accordingly, in some such embodiments, a sense amplifier may only be coupled, or coupleable, to one tracking bit column. For example, each column of a memory block may be coupleable to a single sense amplifier, such as via a column multiplexer. In other embodiments, multiple memory blocks may be coupled to a single sense amplifier (e.g., via a column multiplexer) such that multiple tracking bit columns may be coupled, or coupleable, to a single sense amplifier. In yet other embodiments, each memory block may be coupled to multiple sense amplifiers (e.g., via a column multiplexer) such that multiple sense amplifiers may be coupled, or coupleable, to a single tracking bit column.

Figure 2B:
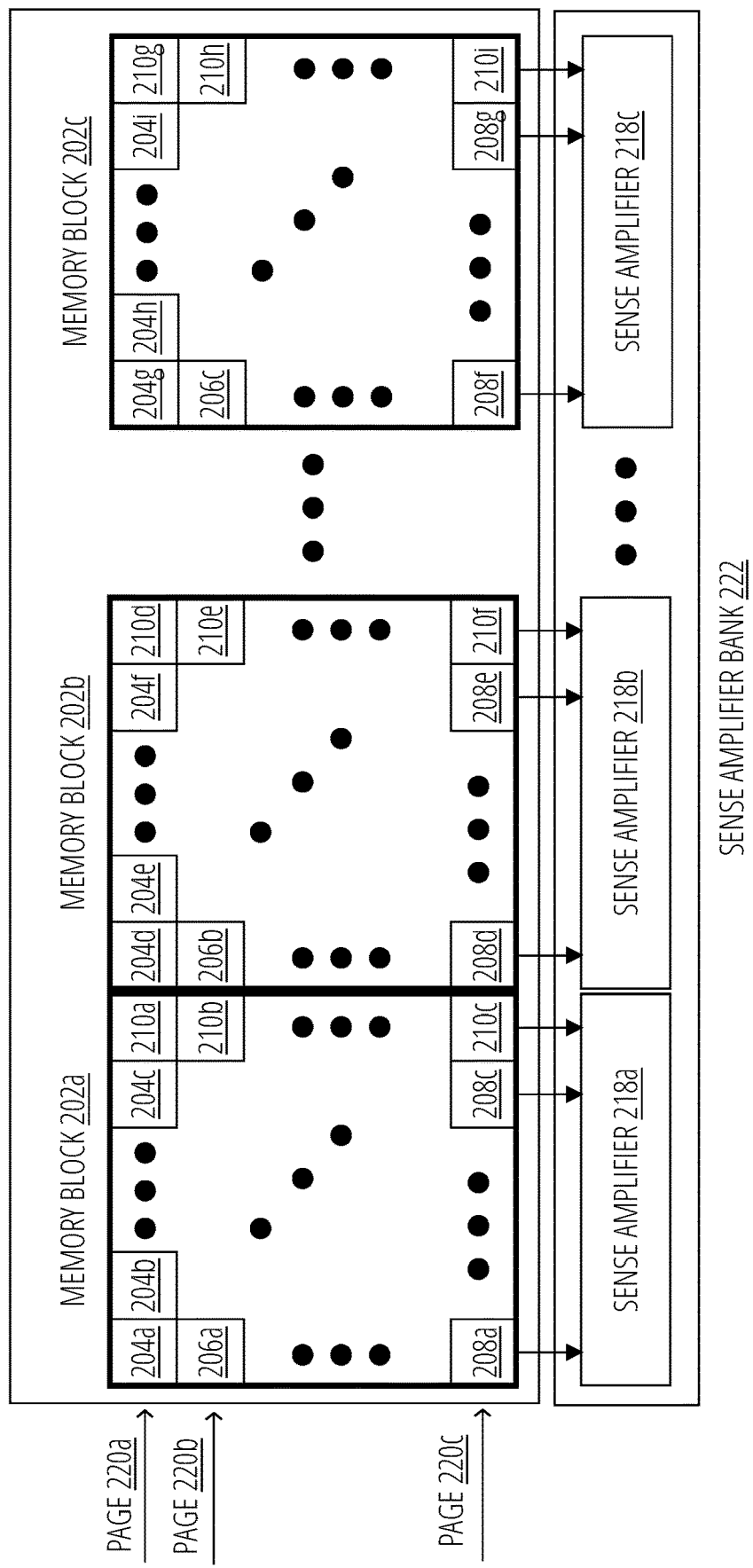
FIG. 2B illustrates various aspects of a memory sector according to some embodiments.

FIG. 2B illustrates various aspects of a memory sector 224 according to some embodiments. In the illustrated embodiment, the memory sector 224 includes an array of one or more memory blocks 202a, 202b, 202c (collectively referred to as memory blocks 202) coupled to a sense amplifier bank 222. Each of the memory blocks 202 may be coupled to a sense amplifier with memory block 202a coupled to sense amplifier 218a, memory block 202b coupled to sense amplifier 218b, and memory block 202c coupled to sense amplifier 218c. Further, each row of memory cells in the array of memory blocks 202 may correspond to a page of the memory. Accordingly, memory sector 224 may include a set of one or more pages 220a, 220b, 220c (collectively referred to as pages 220). One or more components of FIG. 2B may be the same or similar to one or more other components disclosed hereby. For example, memory sector 224 may be the same or similar to one or more of sectors 106. Further, aspects discussed with respect to various components in FIG. 2B may be implemented by one or more other components from one or more other embodiments without departing from the scope of this disclosure. Embodiments are not limited in this context.

Each of the pages 220 may include one or more memory cells from one or more memory blocks. In the illustrated embodiment, page 220a includes memory cells 204a, 204b, 204c, 210a, 204d, 204e, 204f, 210d, 204g, 204h, 204i, 210g; page 220b includes memory cells 206a, 210b, 206b, 210e, 206c, 210h; and page 220c includes memory cells 208a, 208c, 210c, 208d, 208e, 210f, 208f, 208g, 210i. Further, each of the pages 220 may include a set of tracking bits with the set of tracking bits for page 220a including memory cells 210a, 210d, 210g, the set of tracking bits for page 220b including memory cells 210b, 210e, 210h, and the set of tracking bits for page 220c including memory cells 210c, 210f, 210i. In one embodiment, the memory sector 224 may include 128 memory blocks and each memory block may include 33 columns. In such an embodiment, each of the pages 220 may include a set of 128 tracking bits and a set of 4096 bits for storing other data (e.g., user data). Further, the memory sector 224 may contain one or more pages, such as 512 pages or 516 pages with 4 being scratch pages. It will be appreciated that memory sector 224 may include one or more memory blocks stacked vertically in addition to being stacked horizontally. In various embodiments, the scratch pages and/or tracking bits for pages may be read via a bus, such as a C-bus or an R-bus. In one embodiment, a scratch page may be selected via a register. In various embodiments, usage of the scratch pages may be cycled such that a first scratch page is only reused after each of the other scratch pages have been subsequently used once.

In some embodiments, one or more of the scratch rows may be reserved or always used for specific refresh operations. These scratch rows may be reserved for the refresh process of the "Special Memory Rows", "Supervisory Memory Rows", or "Configuration Memory Rows" which are used to store information like trim for various blocks, configuration for various blocks, device under test (DUT) related information (e.g., date of fabrication, lot number, or position on the wafer), various section of boot code that can be updated in the field, security keys, etc. For example, a third scratch row may be reserved for refresh operations related to the Supervisory Memory Rows (SM) pages because of the need of knowing where the key used at boot might be located. At boot, the computing device may search for the presence of various keys written in one or more of the SM pages. If a power down event occurs when the SM page is in process of being refreshed and now is erased, the search of the key in the regular SM page location will fail. Accordingly, the boot process could be configured to search for the key in the third scratch row.

Figure 3A:
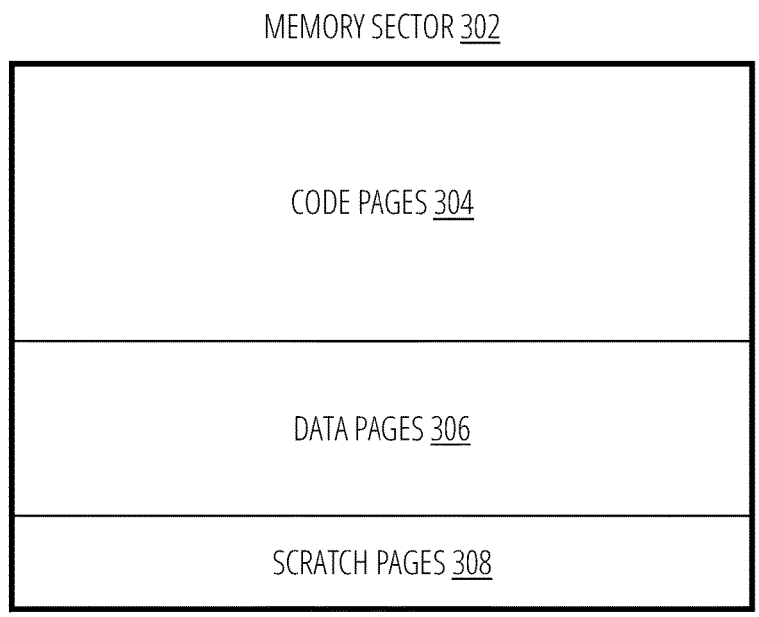
FIG. 3A illustrates exemplary partitions in a memory sector according to some embodiments.

FIG. 3A illustrates exemplary partitions in a memory sector 302 according to some embodiments. In the illustrated embodiment, memory sector 302 includes code pages 304, data pages 306, scratch pages 308. However, in various embodiments, the partitions may be configured and/or reconfigured to fit the demands of a user and thereby provide more memory flexibility and adaptability. The code pages 304 may be utilized to store code, such as firmware. The data pages 306 may be utilized to store data, such as user data, and/or EEPROM emulation. The scratch pages 308 may be utilized to support one or more aspects of program operation related procedures, such as page refreshing. In one embodiment, memory sector 302 may include 352 code pages 304, 160 data pages 306, and 4 scratch pages 308. One or more components of FIG. 3A may be the same or similar to one or more other components disclosed hereby. For example, memory sector 302 may be the same or similar to memory sector 224. Further, aspects discussed with respect to various components in FIG. 3A may be implemented by one or more other components from one or more other embodiments without departing from the scope of this disclosure. Embodiments are not limited in this context.

Figure 3B:
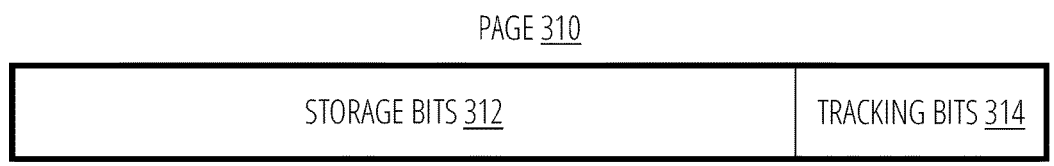
FIG. 3B illustrates exemplary bits included in a page of memory according to some embodiments.

FIG. 3B illustrates exemplary bits included in a page 310 of memory according to some embodiments. In this illustrated embodiment, page 310 includes a set of storage bits 312 and a set of tracking bits 314. The set of storage bits 312 may be utilized for storing data, such as user data, code, scratch data, and the like. The set of tracking bits 314 may be utilized for storing tracking data, such as for determining when page 310 needs to be refreshed and/or when future program operations to page 310 should be prevented. One or more components of FIG. 3B may be the same or similar to one or more other components disclosed hereby. For example, page 310 may be the same or similar to one or more of pages 220, code pages 304, data pages 306, and scratch pages 308. Further, aspects discussed with respect to various components in FIG. 3B may be implemented by one or more other components from one or more other embodiments without departing from the scope of this disclosure. Embodiments are not limited in this context.

Figure 3C:
FIG. 3C illustrates various aspects of program (or write) count tracking bits included in a page of memory according to some embodiments.

FIG. 3C illustrates various aspects of tracking bits 314 included in page 310 of a memory according to some embodiments. In this illustrated embodiment, tracking bits 314 include a freshness counter value 316, an endurance counter value 318, and a page address 320. The freshness counter value 316 may be utilized to determine when page 310 needs to be refreshed, such as based on a program disturb threshold. The endurance counter values may be utilized to determine when future program operations to page 310 should be prevented, such as based on an endurance threshold. The freshness counter may be sector specific. Thus, the current value of the freshness counter may be stored in the tracking bits 314 of page 310 and updated when page 310 is the target of the program operation. The current value of the freshness counter may then be incremented to update the current value and the updated current value may be stored in the tracking bits of the target page of the next program operation in memory sector 302. In many embodiments, the current value of the freshness counter may be tracked, such as using a register. On the other hand, the endurance counter value 318 may be page specific. Thus, the endurance counter value 318 for page 310 may be incremented each time a program operation is performed on page 310. In some embodiments, the page address 320 of tracking bits 314 may be utilized to store an address of page 310 to facilitate reliable page refreshes, such as to recover when power is lost during the refresh. One or more components of FIG. 3C may be the same or similar to one or more other components disclosed hereby. For example, tracking bits 314 may be the same or similar to the tracking bits of one or more of pages 220. Further, aspects discussed with respect to various components in FIG. 3C may be implemented by one or more other components from one or more other embodiments without departing from the scope of this disclosure. Embodiments are not limited in this context.

Figure 4:
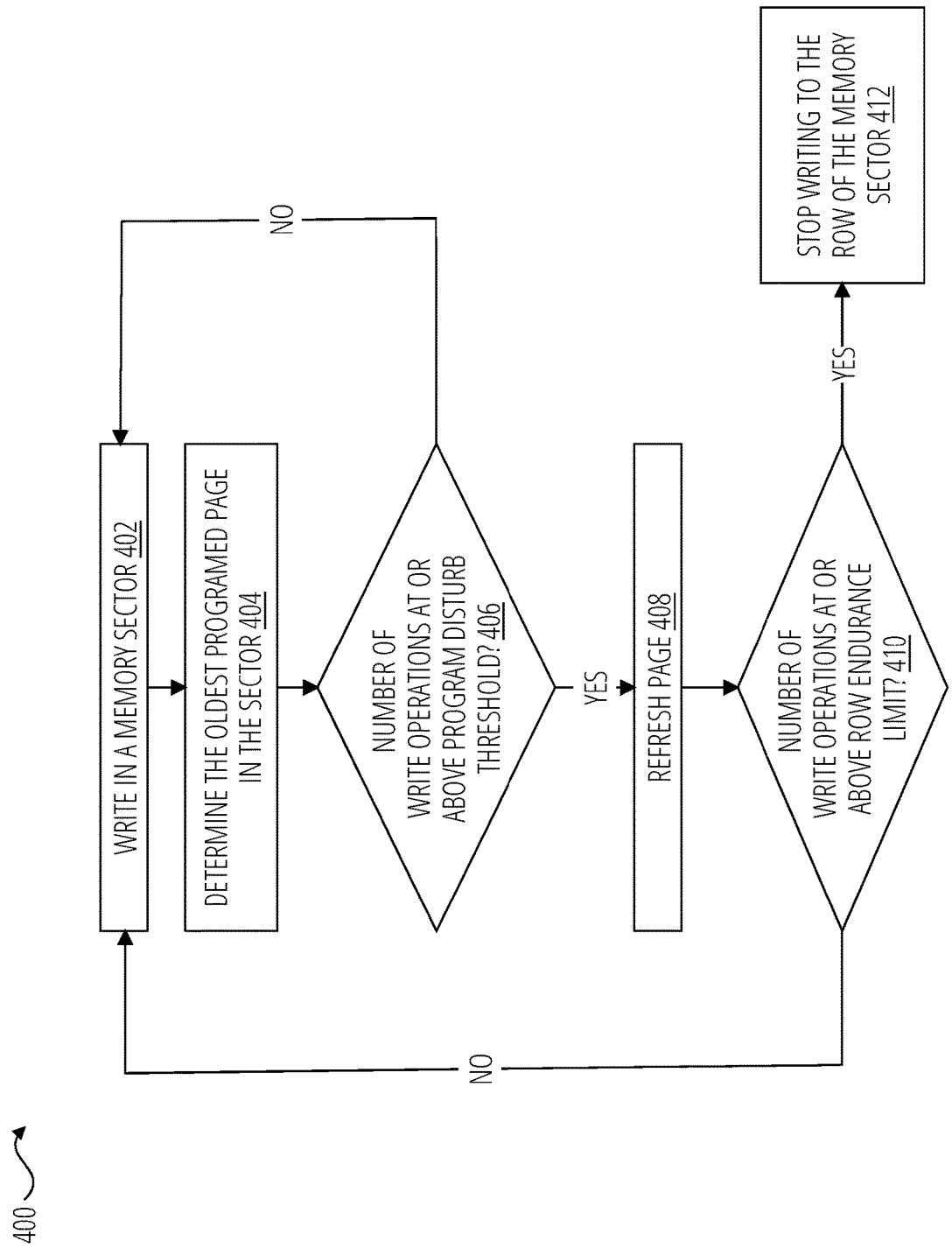
FIG. 4 illustrates an exemplary logic flow for managing a non-volatile memory according to some embodiments.

FIG. 4 illustrates a logic flow 400 for managing a non-volatile memory according to some embodiments. The logic flow 400 may be performed by processing logic that may include hardware and/or control logic (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, at least a portion of logic flow 400 may be performed by one or more components of computing device 102, non-volatile memory 104, program operation control logic 108, or processing device 110. Embodiments are not limited in this context.

With reference to FIG. 4, logic flow 400 illustrates example functions used by various embodiments. Although specific function blocks ("blocks") are disclosed in logic flow 400, such blocks are examples. That is, embodiments are well suited to performing various other blocks or variations of the blocks recited in logic flow 400. It is appreciated that the blocks in logic flow 400 may be performed in an order different than presented, and that not all of the blocks in logic flow 400 may be performed.

Logic flow 400 begins at block 402, where a memory sector is written in. For example, memory sector 224 may be written in. Proceeding to block 404 the oldest programed page in the sector may be determined. For example, page 220c may be determined as the oldest programed page in memory sector 224 because it has the smallest refresh counter value.

Continuing to decision block 406 it may be determined whether the number of write operations for the oldest programmed page is at or above the program disturb threshold. For example, the number of write operations for page 220c may be determined by subtracting the value of the refresh counter in page 220c from the current refresh counter value. Further, the number of write operations may be compared to a program disturb threshold (e.g., 99,000 write operations). In some embodiments, the program disturb threshold may be below the maximum allowable program disturb operations for a page (e.g., 100,000 write operations). In some such embodiments, this may allow for the page to continue to be refreshed without exceeding the maximum allowable program disturb operations for the page. In various embodiments, the program disturb threshold and/or the endurance threshold may be stored in one or more of the Special Configuration Row(s). In many embodiments, the program disturb threshold and/or the endurance threshold may be loaded into registers at boot. Further, these thresholds may be configured either during manufacture or operation.

Referring back to decision block 406, if the number of write operations for the oldest programmed page is below the program disturb threshold, the logic flow 400 may return to block 402. However, if the number of write operations for the oldest programmed page is at or above the program disturb threshold, the logic flow 400 may proceed to block 408. At block 408, the oldest programmed page in the sector may be refreshed. For example, page 220c may be refreshed using scratch pages included in page 220c. Proceeding to decision block 410 it may be determined if the number of write operations for the oldest programmed page is at or above a row endurance limit (e.g., 99,000 write operations). If the number of write operations for the oldest programmed page is below the row endurance limit, the logic flow 400 may return to block 402. However, it the number of write operations for the oldest programmed page is at or above a row endurance limit, the logic flow 400 may proceed to block 412. At block 412 writing to the row of the memory sector may be stopped. For example, writing to page 220c in the future may be prevented, such as by marking the page as unavailable for new user write operations.

FIGS. 5A-5C illustrate various aspects of managing program disturb and/or endurance in non-volatile memory according to some embodiments. Each of FIGS. 5A-5C illustrate freshness counter values and endurance counter values for five different pages during various portions of managing program disturb and/or endurance in non-volatile memory. More specifically, FIG. 5A includes counter values before a program operation 500a, FIG. 5B includes counter values after a program operation 500b, and FIG. 5C includes counter values after a page refresh 500c. Embodiments are not limited in this context.

Referring to FIG. 5A, the counter values before a program operation 500a may include a current freshness counter value 504a of 499, the first page counter values 502a may include a freshness counter value of 1 and an endurance counter value of 1, the second page counter values 502b may include a freshness counter value of 2 and an endurance counter value of 1, the third page counter values 502c may include a freshness counter value of 3 and an endurance counter value of 1, the fourth page counter values 502d may include a freshness counter value of 4 and an endurance counter value of 1, and the fifth page counter values 502e may include a freshness counter value of 5 and an endurance counter value of 1. Accordingly, based on the stored values of the freshness counter, the first page may have been written to first, the second page may have been written to second, the third page may have been written to third, the fourth page may have been written to fourth, and the fifth page may have been written to fifth. It will be appreciated that the writes corresponding to freshness counter values from 6 to 499 may have been performed on other pages in the sector of memory. Further, based on the stored values of the endurance counter each of the five pages may have been written to once.

Referring to FIG. 5B, the counter values after a program operation 500b may include a current freshness counter value 504b of 500, the first page counter values 506a may include a freshness counter value of 1 and an endurance counter value of 1, the second page counter values 506b may include a freshness counter value of 2 and an endurance counter value of 1, the third page counter values 506c may include a freshness counter value of 500 and an endurance counter value of 2, the fourth page counter values 506d may include a freshness counter value of 4 and an endurance counter value of 1, and the fifth page counter values 506e may include a freshness counter value of 5 and an endurance counter value of 1.

Accordingly, the program operation may target the third page and, therefore, the current freshness counter value 504b is stored as the value for the freshness counter in the third page when the program operation is performed on the third page. Further, the oldest programmed page in the sector may be identified as the first page because it has the lowest non-zero value for the freshness counter in the sector of memory. In various embodiments, zero values for counters may be ignored as it indicates the page has not been the target of a program operation. The maximum number of program operations for the set of pages may be determined to be 499 by subtracting the freshness counter value of 1 in the first page from the current freshness counter value 504b of 500. Further, in the example described with respect to FIGS. 5A-5C, the program disturb threshold for the sector may be 499, and, therefore, a refresh of the first page is triggered as discussed in more detail below with respect to FIG. 5C. Additionally, the endurance counter may be incremented to 2 (from the endurance counter value of 1 in third page counter values 502c) and stored as the value for the endurance counter in the third page when the program operation is performed on the third page. In some embodiments, the current freshness counter value 504a of 499 may be incremented to the current freshness counter value 504b of 500 in response to identifying the program operation that targets the third page.

Referring to FIG. 5C, the counter values after a page refresh 500c may include a current freshness counter value 504c of 501, the first page counter values 508a may include a freshness counter value of 501 and an endurance counter value of 2, the second page counter values 508b may include a freshness counter value of 2 and an endurance counter value of 1, the third page counter values 508c may include a freshness counter value of 500 and an endurance counter value of 2, the fourth page counter values 508d may include a freshness counter value of 4 and an endurance counter value of 1, and the fifth page counter values 508e may include a freshness counter value of 5 and an endurance counter value of 1.

Accordingly, the refresh operation may result in a program operation occurring to the first page and, therefore, the current freshness counter value 504c is stored as the value of the freshness counter in the first page when the first page is refreshed. Additionally, the endurance counter may be incremented to 2 (from the endurance counter value of 1 in first page counter values 506*a*) and stored as the value for the endurance counter in the third first page when the program operation is performed on the first page as part of the refresh operation.

Further, the oldest programmed page in the sector may be identified as the second page because it has the lowest value for the freshness counter in the sector of memory. The maximum number of program operations for the set of pages may be determined to be 499 by subtracting the freshness counter value of 2 in the second page from the current freshness counter value 504*c* of 501. In response, a refresh operation may be triggered for the second page. Similarly, the refresh operation for the second page may trigger a refresh operation for the fourth page and the refresh operation on the fourth page may trigger a refresh operation for the fifth page. In this way, a refresh operation may trigger a cascade of subsequent refresh operations.

Figure 6:
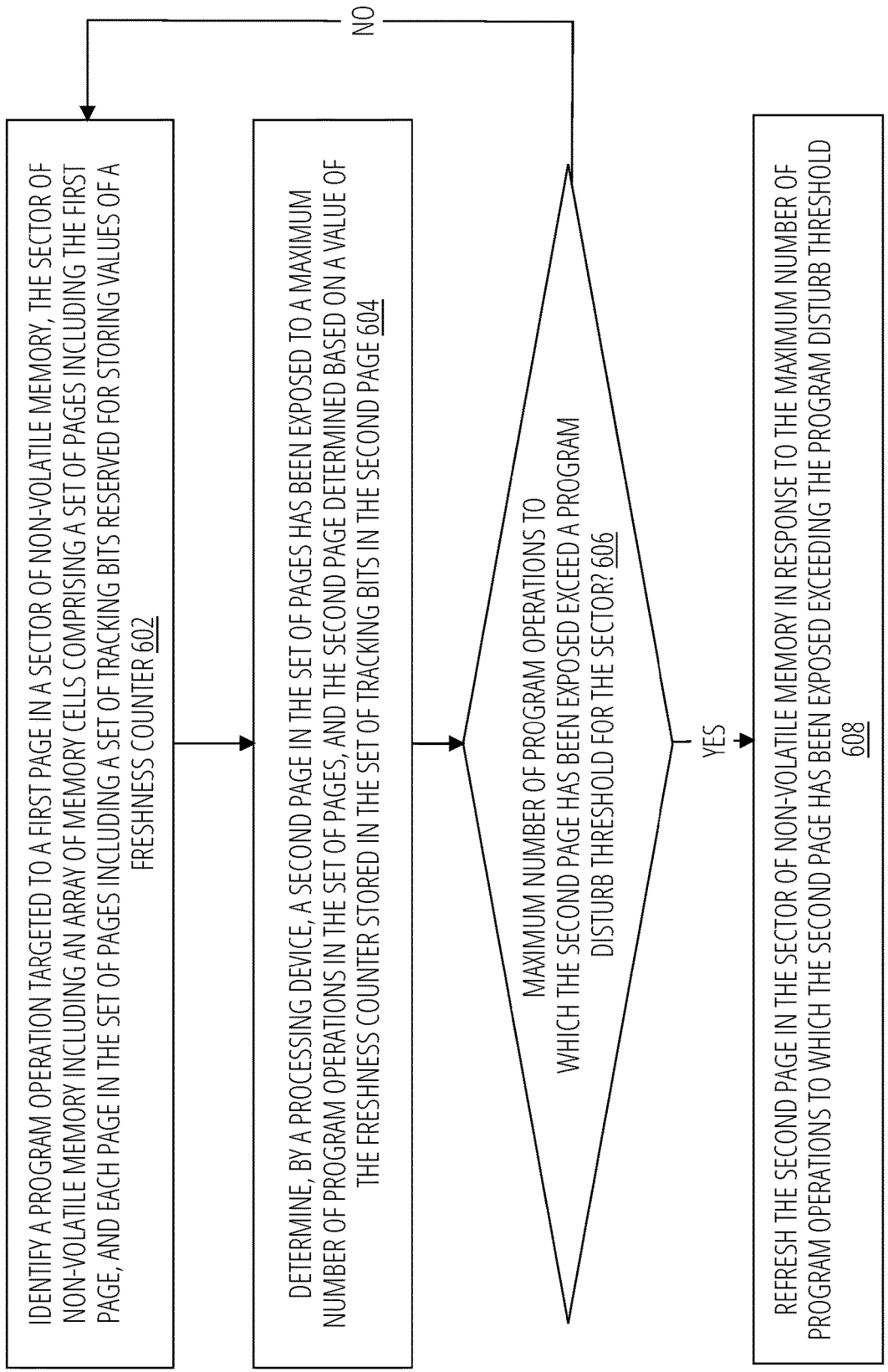
FIG. 6 illustrates an exemplary logic flow for refreshing a page of memory according to some embodiments.

FIG. 6 illustrates a logic flow 600 for refreshing a page of memory according to some embodiments. The logic flow 600 may be performed by processing logic that may include hardware and/or control logic (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, at least a portion of logic flow 600 may be performed by one or more components of computing device 102, non-volatile memory 104, program operation control logic 108, or processing device 110. Embodiments are not limited in this context.

With reference to FIG. 6, logic flow 600 illustrates example functions used by various embodiments. Although specific function blocks ("blocks") are disclosed in logic flow 600, such blocks are examples. That is, embodiments are well suited to performing various other blocks or variations of the blocks recited in logic flow 600. It is appreciated that the blocks in logic flow 600 may be performed in an order different than presented, and that not all of the blocks in logic flow 600 may be performed.

Logic flow 600 begins at block 602, where a program operation targeted to a first page in a sector of non-volatile memory may be identified. Further, the sector of non-volatile memory may include an array of memory cells forming a set of pages including the first page, and each page in the set of pages may include a set of tracking bits reserved for storing values of a freshness counter. For example, a program operation targeted to page 220*b* may be identified.

Proceeding to block 604, a processing device may determine a second page in the set of pages that has been exposed to a maximum number of program operations for the set of pages. Further the second page may be determined based on a value of the freshness counter stored in the set of tracking bits in the second page. For example, processing device 110 may determine page 220*c* has the maximum number of program operations for the set of pages included in memory sector 224 based on a value of the freshness counter stored in the set of tracking bits in page 220*c*. For example, the page 220*c* may be determined to have been exposed to the maximum number of program operations for the set of pages in memory sector 224 based on the value of the freshness counter stored in the tracking bits of page 220*c* having a smallest value of the freshness counter for the set of pages in memory sector 224. Further the maximum number of program operations being exposed to before a refresh is required may be determined as the difference between a current value of the freshness counter and the value of the freshness counter stored in the tracking bits of page 220*c*.

At decision block 606 it may be determined if the maximum number of program operations seen by a row exceed a program disturb threshold. If the maximum number of program operations seen by the said row does not exceed the program disturb threshold (e.g., 99,000), the logic flow 600 may return to block 602. However, if the maximum number of program operations exceed the program disturb threshold, the logic flow 600 may proceed to block 608. At block 608 the second page in the sector of non-volatile memory may be refreshed in response to the maximum number of program operations exceeding the program disturb threshold. For example, page 220*c* may be refreshed in response to the maximum number of program operations exceeding the program disturb threshold.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those demanding physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," "various embodiments", and the like means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," "various embodiments", and the like in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying", "determining," "comparing," "refreshing,"

"incrementing," "performing," "copying," "storing," or the like, refer to the actions and processes of a processing device, a non-volatile memory, an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes at least one of A or B" or "X includes A or B" is intended to mean any of the natural inclusive permutations. That is, if X includes A; X includes B; or X includes both A and B, then "X includes at least one of A or B" or "X includes A or B" is satisfied under any of the foregoing instances. Similarly, "X includes one or more of A and B" should be interpreted the same as "X includes at least one of A or B". In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus (e.g., such as a computing device including at least one a non-volatile memory that performs the operations herein. This apparatus may be specially constructed for the demanded purposes, or it may include firmware or hardware logic selectively activated or reconfigured by the apparatus. Such firmware may be stored in a non-transitory computer-readable storage medium, such as, but not limited to, read-only memories (ROMs), random access memories (RAMs), EPROMS, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments. Further, a "computer-readable medium" or "computer-readable storage medium" may be non-transitory.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    identifying a program operation targeted to a first page in a sector of non-volatile memory, the sector of non-volatile memory including an array of memory cells comprising a set of pages including the first page, and each page in the set of pages including a set of tracking bits reserved for storing values of a freshness counter;
    determining, by a processing device, a second page in the set of pages has been exposed to a maximum number of program operations in the set of pages, and the second page determined based on a value of the freshness counter stored in the set of tracking bits in the second page;
    determining that the maximum number of program operations to which the second page has been exposed exceeds a program disturb threshold for the sector of non-volatile memory; and
    refreshing the second page in the sector of non-volatile memory in response to determining that the maximum number of program operations to which the second page has been exposed exceeds the program disturb threshold for the sector of non-volatile memory.

2. The method of claim 1, wherein determining the second page has been exposed to the maximum number of program operations in the set of pages comprises identifying the second page as having a lowest non-zero value for the freshness counter in the set of pages.

3. The method of claim 1, further comprising determining the maximum number of write operations for the set of pages based on a difference between a current value of the freshness counter and the value for the freshness counter stored in the set of tracking bits in the second page.

4. The method of claim 1, further comprising performing the program operation targeted to the first page, wherein performance of the program operation includes storing a current value of the freshness counter in the set of tracking bits in the first page.

5. The method of claim 4, wherein the program operation comprises a first program operation and the method further comprising:
    incrementing the freshness counter to an updated value;
    identifying a second program operation targeted to a different page in the sector of non-volatile memory; and
    performing the second program operation targeted to the different page, wherein performance of the second program operation includes storing the updated value of the freshness counter in the set of tracking bits in the different page.

6. The method of claim 1, wherein refreshing the second page in the sector of non-volatile memory comprises:
    copying data stored in bits of the second page other than the set of tracking bits to a scratch page in the set of pages;
    storing the data from the scratch page in the bits of the second page other than the set of tracking bits; and
    storing a current value of the freshness counter in the set of tracking bits in the second page.

7. The method of claim 6, wherein the set of tracking bits for each page includes a value for the freshness counter and a value for an endurance counter and wherein refreshing the second page in the sector of non-volatile memory further comprises:

incrementing a current value for the endurance counter in the second page to an updated value; and storing the updated value of the endurance counter in the set tracking bits of the second page.

8. The method of claim 1, further comprising:

determining that the maximum number of program operations for the second page exceeds an endurance threshold for the second page; and preventing future program operations to the second page in response to determining that the maximum number of program operations for the second page exceeds the endurance threshold.

9. A non-volatile memory comprising:

a sector including an array of memory cells, the array of memory cells comprises a set of pages and each page in the set of pages including a set of tracking bits reserved for storing values of a freshness counter; and control logic comprising a processing device, the control logic configured to:

identify a program operation targeted to a first page in the sector;

determine a second page in the set of pages has been exposed to a maximum number of program operations in the set of pages, and the second page determined based on a value of the freshness counter stored in the set of tracking bits in the second page;

determine that the maximum number of program operations to which the second page has been exposed exceeds a program disturb threshold for the sector; and refresh the second page in the sector of non-volatile memory in response to determining that the maximum number of program operations to which the second page has been exposed exceeds the program disturb threshold for the sector.

10. The non-volatile memory of claim 9, wherein each tracking bit for a respective page is coupled to a different sense amplifier.

11. The non-volatile memory of claim 9, wherein each page in the set of pages corresponds to a different row of the array of memory cells.

12. The non-volatile memory of claim 9, wherein a first column in the array of memory cells includes a first tracking bit from each page in the set of pages and a second column in the array of memory cells includes a second tracking bit from each page in the set of pages.

13. The non-volatile memory of claim 12, wherein the first column is coupled to a first sense amplifier and the second column is coupled to a second sense amplifier.

14. The non-volatile memory of claim 9, wherein the sector includes at least one page reserved for storing data during a page refresh.

15. The non-volatile memory of claim 9, wherein determination that the second page has reached the maximum number of write operations for the set of pages comprises identification of the second page as having a lowest non-zero value for the freshness counter in the set of pages.

16. The non-volatile memory of claim 9, wherein the control logic is further configured to determine the maximum number of write operations for the set of pages based on a difference between a current value of the freshness counter and a value for the freshness counter stored in the set of tracking bits in the second page.

17. The non-volatile memory of claim 9, wherein the control logic is further configured to perform the program operation targeted to the first page, wherein performance of the program operation includes storing a current value of the freshness counter in the set of tracking bits in the first page.

18. A system comprising:

a sector of non-volatile memory including an array of memory cells, the array of memory cells comprises a set of pages and each page in the set of pages including a set of tracking bits reserved for storing values of a freshness counter;

a plurality of sense amplifiers, wherein each tracking bit for a respective page in the set of pages is coupled to a different one of the plurality of sense amplifiers;

control logic comprising a processing device, the control logic configured to:

identify a program operation targeted to a first page in the sector;

determine a second page in the set of pages has been exposed to a maximum number of program operations in the set of pages, and the second page determined based on a value of the freshness counter stored in the set of tracking bits in the second page;

determine that the maximum number of program operations to which the second page has been exposed exceeds a program disturb threshold for the sector of non-volatile memory; and refresh the second page in the sector of non-volatile memory in response to determining that the maximum number of program operations to which the second page has been exposed exceeds the program disturb threshold for the sector of non-volatile memory.

19. The system of claim 18, wherein each page in the set of pages corresponds to a different row of the array of memory cells.

20. The system of claim 18, wherein a first column in the array of memory cells includes a first tracking bit from each page in the set of pages and a second column in the array of memory cells includes a second tracking bit from each page in the set of pages.

* * * * *